(12) United States Patent
Guidash

(10) Patent No.: US 6,423,994 B1
(45) Date of Patent: *Jul. 23, 2002

(54) ACTIVE PIXEL SENSOR WITH INTER-PIXEL FUNCTION SHARING

(75) Inventor: Robert M. Guidash, Rush, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/628,362

(22) Filed: Jul. 28, 2000

Related U.S. Application Data

(63) Continuation of application No. 08/808,444, filed on Feb. 28, 1997, now Pat. No. 6,160,281.

(51) Int. Cl.$^7$ .................... H01L 27/146; H03K 3/42
(52) U.S. Cl. ........................ 257/292; 327/515
(58) Field of Search ................ 257/258, 290, 257/291, 292; 327/515

(56) References Cited

U.S. PATENT DOCUMENTS

| | | | |
|---|---|---|---|
| 4,636,865 A | 1/1987 | Imai | 358/213 |
| 5,471,515 A | 11/1995 | Fossum et al. | 257/292 |
| 5,587,596 A | 12/1996 | Chi et al. | 257/292 |
| 5,608,243 A | 3/1997 | Chi et al. | 257/292 |
| 5,614,744 A | 3/1997 | Merrill | 257/292 |
| 5,631,704 A | 5/1997 | Dickinson et al. | 257/292 |
| 6,160,281 A | * 12/2000 | Guidash | 257/292 |

FOREIGN PATENT DOCUMENTS

| | | | |
|---|---|---|---|
| EP | 0 757 476 A2 | 2/1997 | H04N/3/15 |
| JP | 63-261744 | 10/1988 | H01L/27/14 |
| WO | WO 97/42661 | 11/1997 | H01L/27/146 |

OTHER PUBLICATIONS

ISSCC97/Session 11/Imaging Circuits and Systems/Papers FA 11.1—FA 11.5, *IEEE International Solid–State Circuits Conference*, pp. 180–189 and 452–454.

Hon–Sum Wong, "Technology and Device Scaling Considerations for CMOS Imagers", *IEEE Transactions on Electron Devices*, vol. 43, No. 12, Dec. 1996, pp. 2131–2142.

Eric R. Fossum, "Active Pixel Sensors: Are CCD's Dinosaurs", *SPIE*, vol. 1900, pp. 2–14.

R. H. Nixon, et al., "128X128 CMOS Photodiode–Type Active Pixel Sensor With On–Chip Timing, Control and Signal Chain Electronics", *Proceedings of the SPIE*, vol. 2415 (1995), pp. 117–123.

* cited by examiner

*Primary Examiner*—Gene M. Munson
(74) *Attorney, Agent, or Firm*—Peyton C. Watkins

(57) ABSTRACT

An image sensor having a plurality of pixels comprising a semiconductor material of a first conductivity type with at least two adjacent pixels, each of the pixels has a photodetector formed within the substrate and an electrical function that is shared between the adjacent pixels integrated within the adjacent pixels. The electrical function can be: a transfer gate, a reset gate, a row select gate, an amplifier drain, an output node, a floating diffusion, a reset drain, a lateral overflow gate, an overflow drain or an amplifier, that is shared between multiple pixels resulting in a saving of space.

1 Claim, 11 Drawing Sheets

ACTIVE PIXEL SENSOR WITH INTER-PIXEL FUNCTION SHARING

CROSS-REFERENCE TO RELATED APPLICATIONS

This is a continuation application of Ser. No. 08/808,444, Feb. 28, 1997, now U.S. Pat. No. 6,160,281, by Robert M. Guidash, and entitled,"Active Pixel Sensor With Inter-Pixel Function Sharing ".

FIELD OF THE INVENTION

The invention relates generally to the field of solid state image sensors, specifically imagers referred to as Active Pixel Sensors, (APS), and to providing greater fill factors within APS sensors.

BACKGROUND OF THE INVENTION

APS are solid state imagers wherein each pixel typically contains a photo-sensing means, reset means, a charge transfer means, a charge to voltage conversion means, and all of part of an amplifier. Prior art APS devices have been operated in a manner where each line, or row, of the imager is selected and then read out using a column select signal (analogous to the selection and reading of a memory device). In prior art devices the connection, or contact, to the various nodes within the pixels of a given row is accomplished on a per pixel basis. This is true even though the pixels exist on the same electrical node within a row (see FIG. 1). Since these contact regions are placed in each pixel, and contact regions typically consume a large amount of pixel area due to the overlap of metal layers required, inclusion of these contact regions in each pixel reduces the fill factor for the pixel because it takes up area that could otherwise be used for the photodetector. This reduces the sensitivity and saturation signal of the sensor. This adversely affects the photographic speed and dynamic range of the sensor, performance measures that are critical to obtaining good image quality. In addition prior art APS pixels have included the entire amplifier, address and reset transistors within a single pixel, and have made operative interconnection of these components and the photodetector entirely within a single pixel boundary. This leads to inefficiencies of layout and produces pixels with small fill factors.

In order to build high resolution, small pixel APS devices, it is necessary to use sub-□m CMOS processes in order to minimize the area of the pixel allocated to the row select transistor and other parts of the amplifier in the pixel. In essence, it takes a more technologically advanced and more costly process to realize the same resolution and sensitivity in an APS device as compared to a standard charge coupled device (CCD) sensor. However, APS devices have the advantages of single 5V supply operation, lower power consumption, x-y addressability, image windowing, and the ability to effectively integrate signal processing electronics on-chip, when compared to CCD sensors.

A typical prior art APS pixel 10 is shown in FIG. 1. The pixel comprises a photodetector (PDET) 11, that can be either a photodiode or photogate, a transfer gate (TG) 12, floating diffusion (FD) 14, reset transistor with a reset gate (RG) 16, row select transistor with a row select gate (RSG) 4, and signal transistor (SIG) 5. Note that all of the electrical components required to readout and address the pixel are contained entirely within a single pixel boundary, and are operatively connected entirely within a single pixel boundary. Regions to provide contact to each of the various electrical nodes within the pixel that are common to a row are designated in FIG. 1 and shown schematically in FIG. 2. These are Transfer Gate Contact (TGC) 13, Reset Gate Contact (RGC) 17, and Row Select Gate Contact (RSGC) 3. Additionally there are contact regions that are common to a column. These are also shown in FIGS. 1 and 2. These are power supply contacts (VDDC) 9 and the pixel output node contact (OUTC) 8. Note that there are separate and individual contact regions in each pixel even though some are common to a row or column. It is evident that the area consumed by these contact regions is a significant portion of the pixel area, thus limiting the area available for the photodetector, which reduces the fill factor and sensitivity of the pixel.

It should be apparent, from the foregoing discussion, that there remains a need in the art for APS sensors that have increased fill factors. This and other problems are addressed by the present invention.

SUMMARY OF THE INVENTION

The present invention addresses the foregoing problems. Briefly summarized, according to one aspect of the present invention the an image sensor having a plurality of pixels comprising: a semiconductor material of a first conductivity type; and at least two adjacent pixel having photodetectors formed within the substrate such that each pixel has at least one electrical function that is shared by the adjacent pixels.

The pixel layout innovation provided by the present invention yields a higher fill factor for the pixel. One approach to providing an image sensor with the sensitivity of a CCD and the advantages of an APS device is to improve the fill factor, thereby, increasing the corresponding sensitivity of the APS device. This is accomplished by the present invention in several ways: first by eliminating the need for a separate signal line contact areas in each pixel. Secondly, by sharing electrical components between pixels. Finally, fill factor can be increased by operatively interconnecting the electrical components by traversing pixel boundaries and using the array to complete the routing. These are all accomplished while maintaining the ability to selectively address specific pixels of the APS device.

The invention provides a means for reducing the area per pixel required for these contact regions. Conceptually, it can be described in the following manner. The design of each pixel is done to place the contact regions of the row related nodes along or near the left and right edges of the pixel, and the column related contact regions along or near the top or bottom edge of the pixel, (see FIG. 3), allowing neighboring pixels to share these contact regions and alleviating the requirement of having separate contact regions in each pixel. In the case of the preferred embodiment of the present invention, contact regions are required for every 2 pixels as compared to each pixel as required by prior art devices. Hence, the area required per pixel by the present invention is reduced, resulting in an increase in fill factor for the pixel.

Additionally, one can use the VDD drain region of an adjacent pixel as a lateral overflow drain. This is a similar "pixel sharing" concept where the VDD drain region serves as the drain of the signal transistor for one pixel and the lateral overflow drain for the adjacent pixel or pixels. Since a separate lateral overflow drain region is not needed for each pixel, more area can be allocated to the photodetector, providing increased fill factor.

Another means to realize fill factor improvement is to utilize the row at a time read out operation, and provide a floating diffusion and amplifier for every two pixels instead of for each pixel. Since only one row is read out at a given time, a single floating diffusion and amplifier can be used for 2 adjacent pixels that are in separate rows. Once again the photodetector area per pixel can be increased, or the fill factor can be maintained to produce a smaller pixel.

Finally, by operatively interconnecting the pixel components such that the components orientation traverse pixel boundaries (rather than providing a schematically complete layout within a single pixel boundary) layout efficiencies can be utilized to improve the fill factor of the pixel.

These and other aspects, objects, features, and advantages of the present invention will be more clearly understood and appreciated from a review of the following detailed description of the preferred embodiments and appended claims, and by reference to the accompanying drawings.

ADVANTAGEOUS EFFECT OF THE INVENTION

The present invention has the following advantages. All of the features and advantages of prior art APS devices are maintained while requiring less pixel area for contact regions. This provides the following advantages:

higher fill factor, sensitivity and saturation signal for the same pixel size;

smaller pixel and device size for the same fill factor.

BRIEF DESCRIPTION OF THE DRAWINGS

To facilitate understanding, identical reference numerals have been used, where possible, to designate identical elements that are common to the figures.

DETAILED DESCRIPTION OF THE INVENTION

One physical embodiment of the new pixel architecture is shown in

Figure 1:
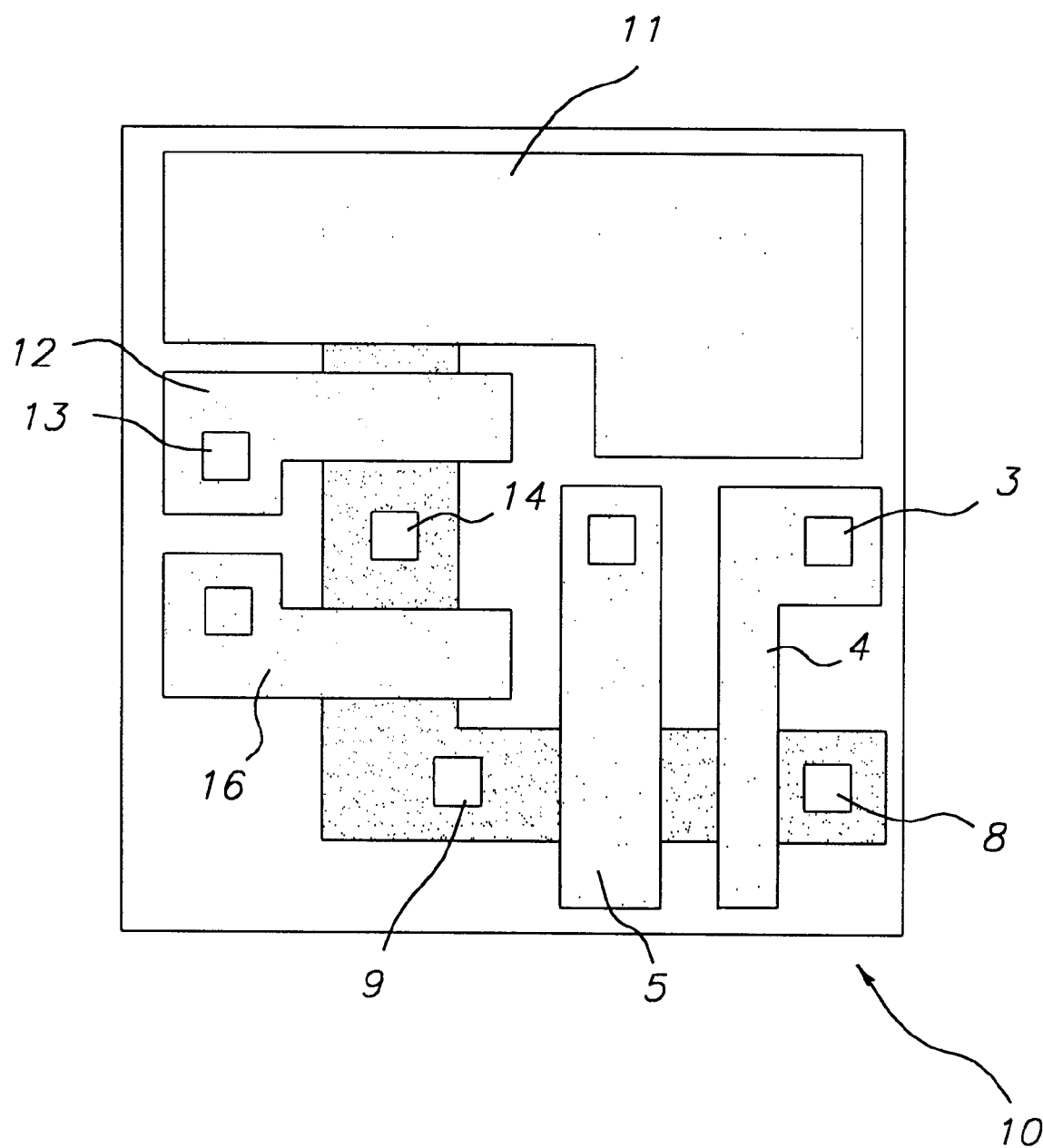
FIG. 1 is a top view of prior art APS pixel.
Figure 2:
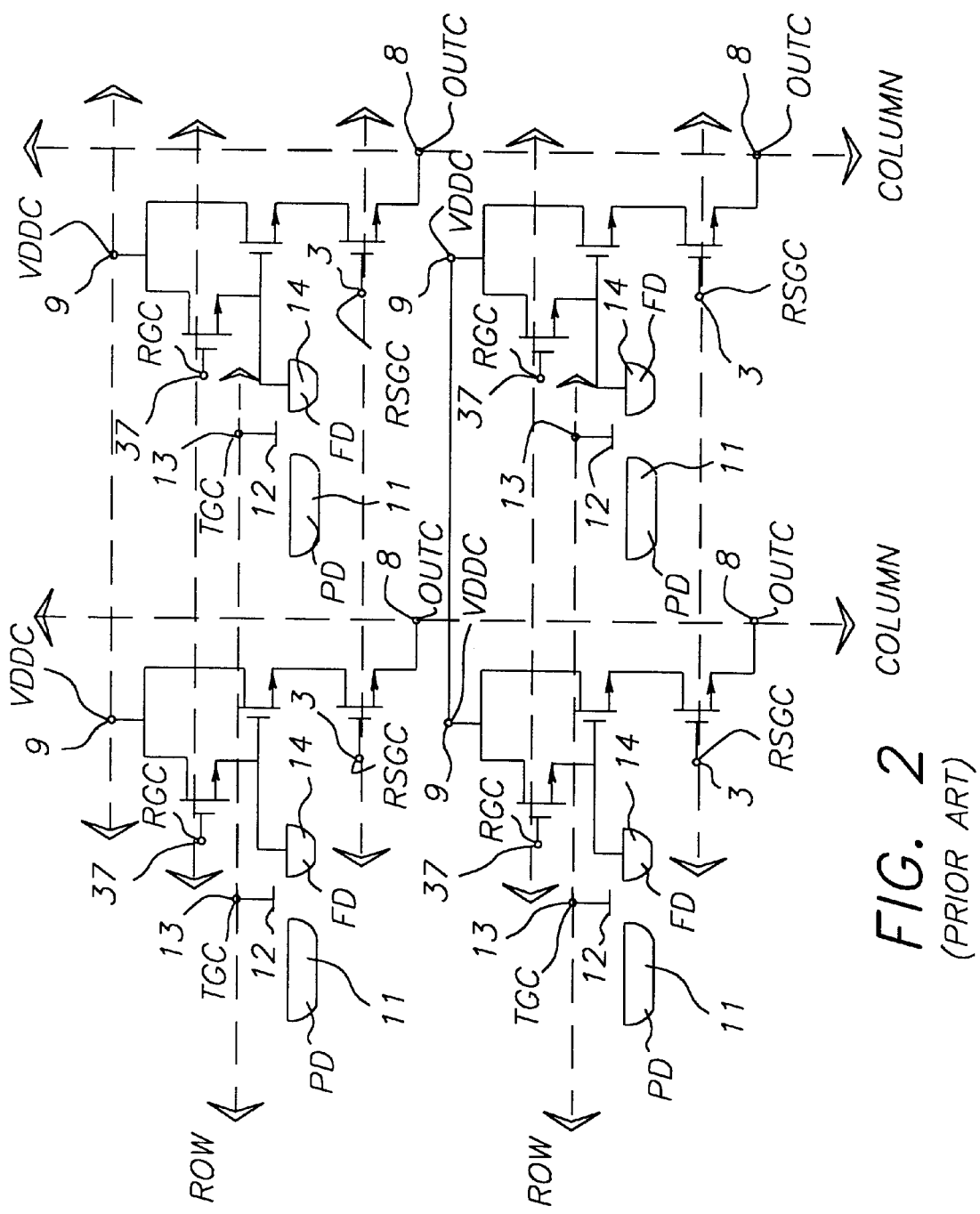
FIG. 2 is a schematic of an array of four prior art pixels as shown in FIG. 1.
Figure 3:
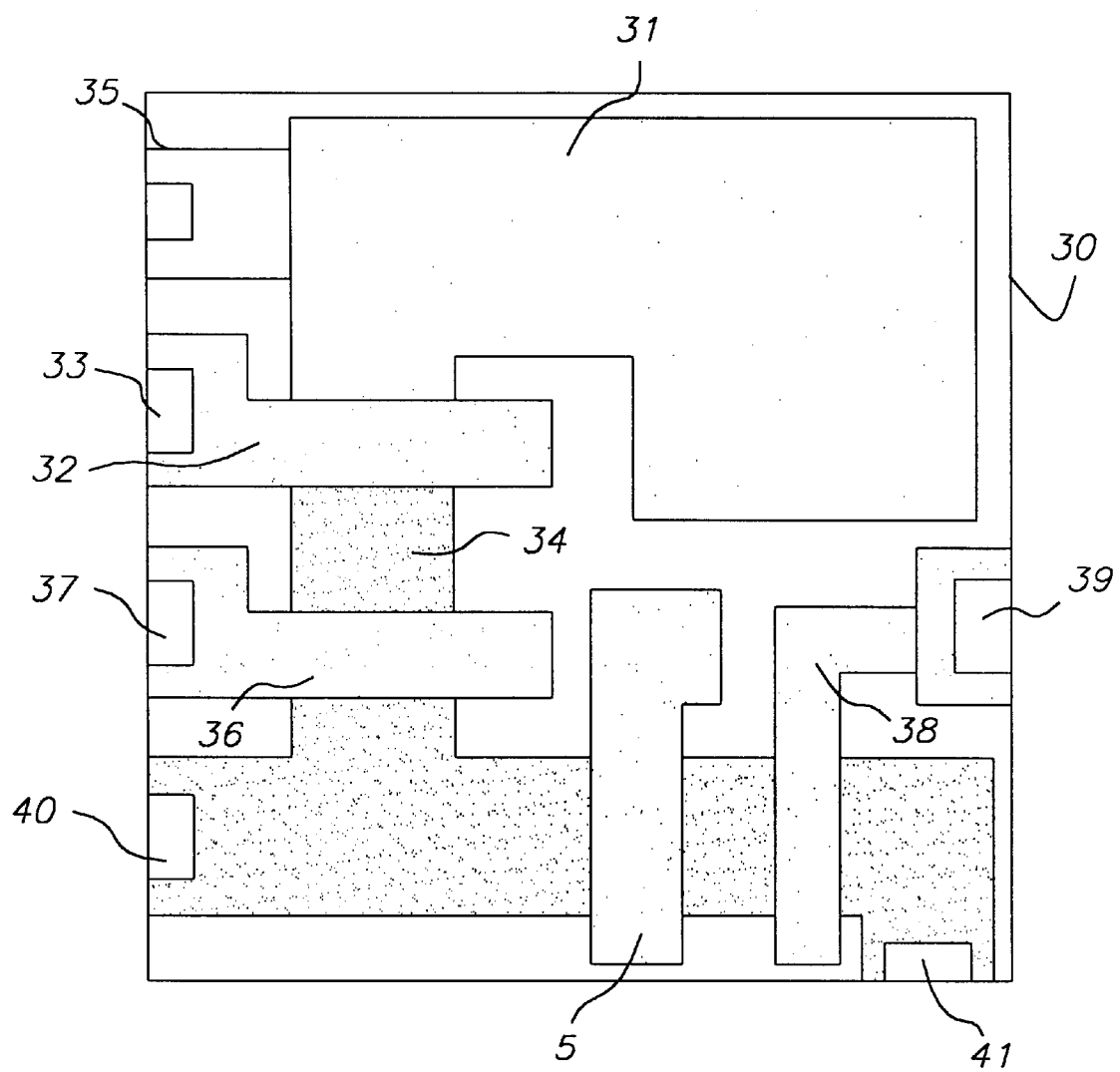
FIG. 3 is a top view of a pixel as envisioned by the present invention; having reduced contact area.

FIG. 3. Other specific physical embodiments are realizable. This one is chosen for illustration. The pixel 30 has a photodetecting area 31 that accumulates charge from incident light and transfers the stored charge under control of the transfer gate 32 to a floating diffusion 34.

There are various contact regions that are associated with the circuit elements recited within the above description. The transfer gate 32 has a transfer gate contact 33, the reset gate 36 has a reset gate contact 37 and the row select gate 38 has a row select gate contact (RSGC) 39. These contact regions are row common contact regions, and are placed appropriately along the left and right side of pixel 30 boundaries. In the preferred embodiment as shown if FIG. 3, half of the contact region for reset gate contact 37 and transfer gate contact 33 are placed on the left edge of the pixel. Half of a contact region for the row select gate contact 39 is placed along the right edge of the pixel. Next the column common contact regions VDDC 40 and OUTC 41 are placed appropriately along the bottom edge of the pixel. This architecture allows these various elements to be shared between pixels, in terms of function and also in terms of pixel area used to construct these elements.

In the case where the photodetector 31 is a photogate, the photogate contact region 35 can be shared between photogates of adjacent pixels.

Figure 4A:
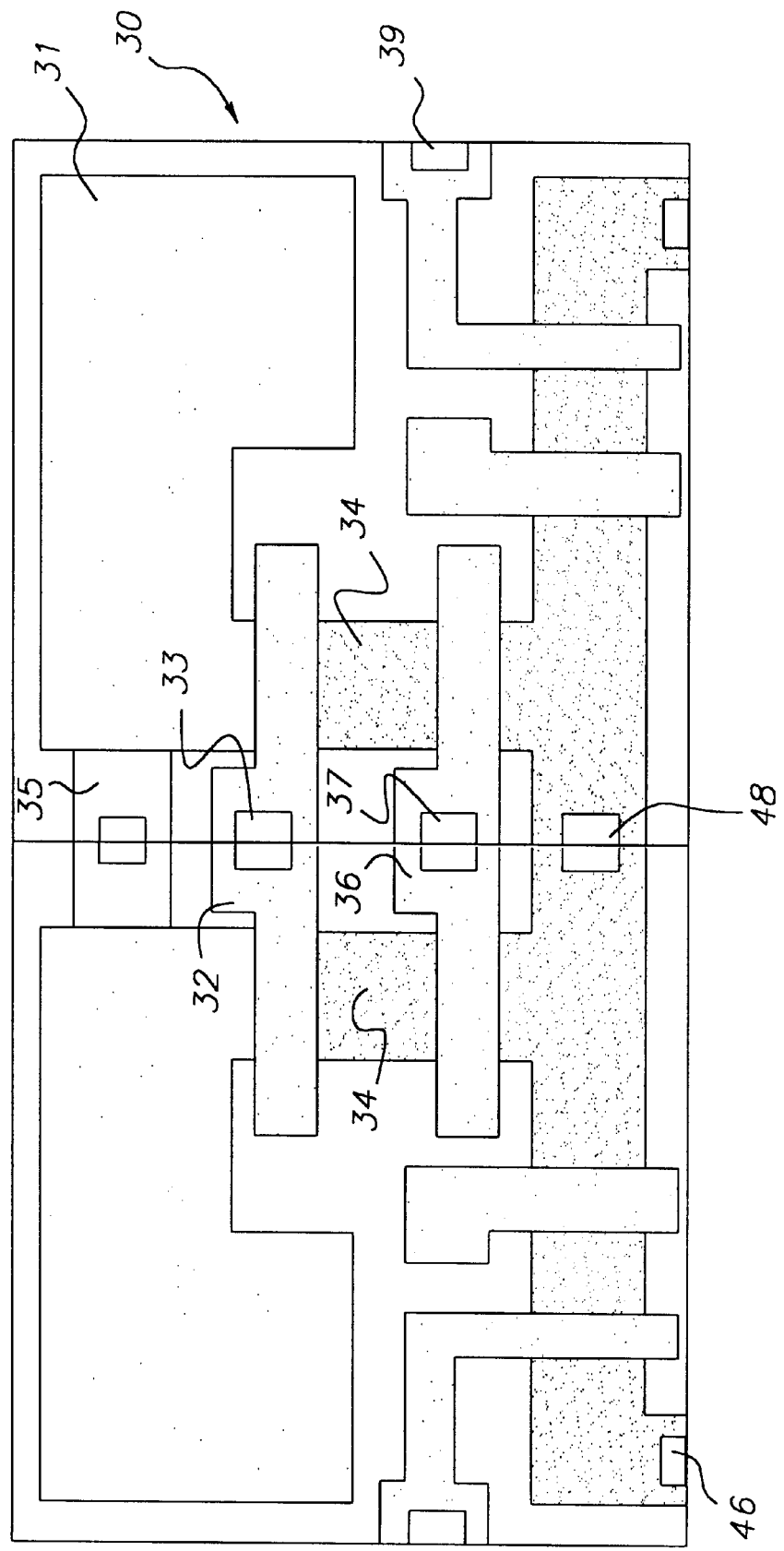
FIG. 4A is a top view of two pixels of the present invention that illustrates the sharing of contact regions.
Figure 4B:
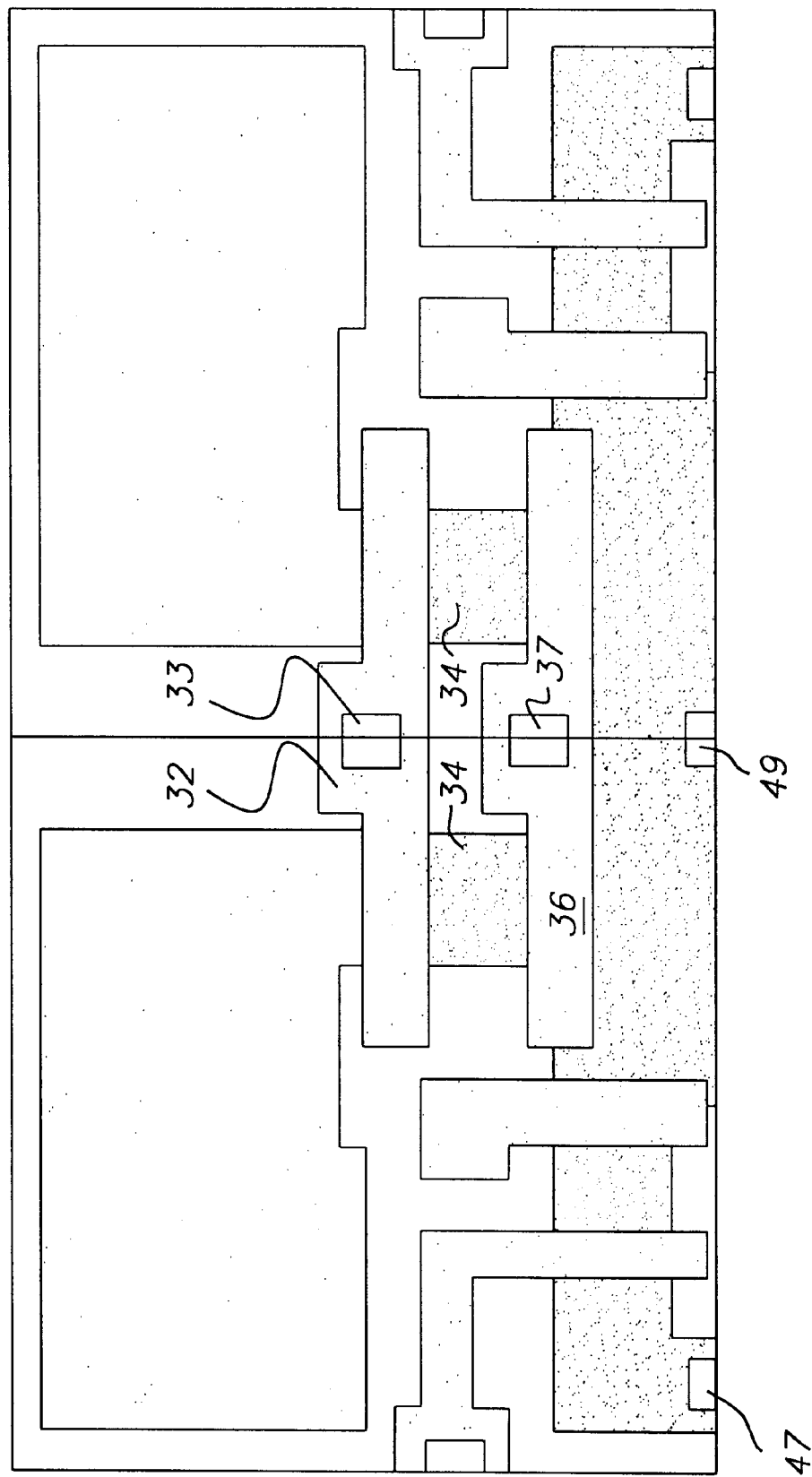
FIG. 4B is a top view of the present invention as shown if FIG. 4a with reduced VDD contact region.
Figure 5A:
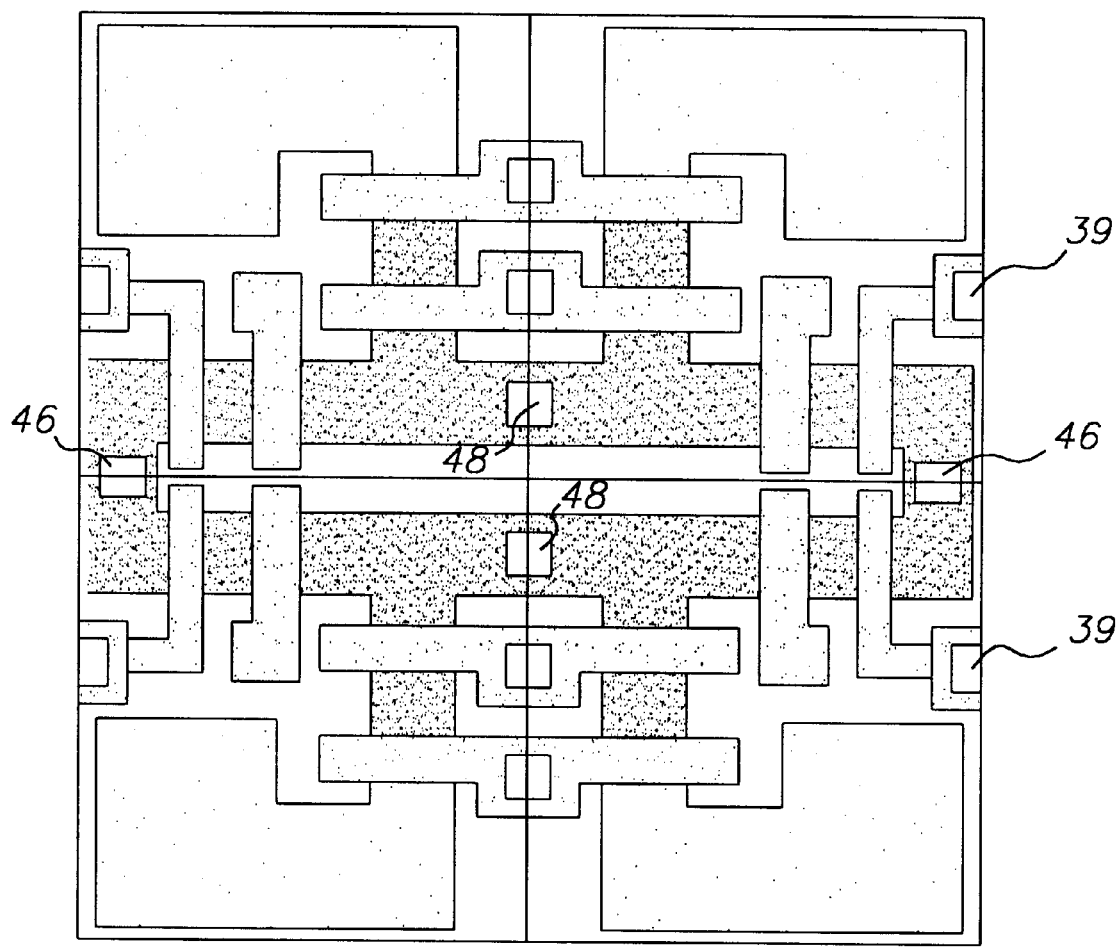
FIG. 5A is a top view of 4 pixels of the present invention that are a mirror duplication of the two pixels in FIG. 4A that illustrates the sharing of contact regions that are common to a column.
Figure 5B:
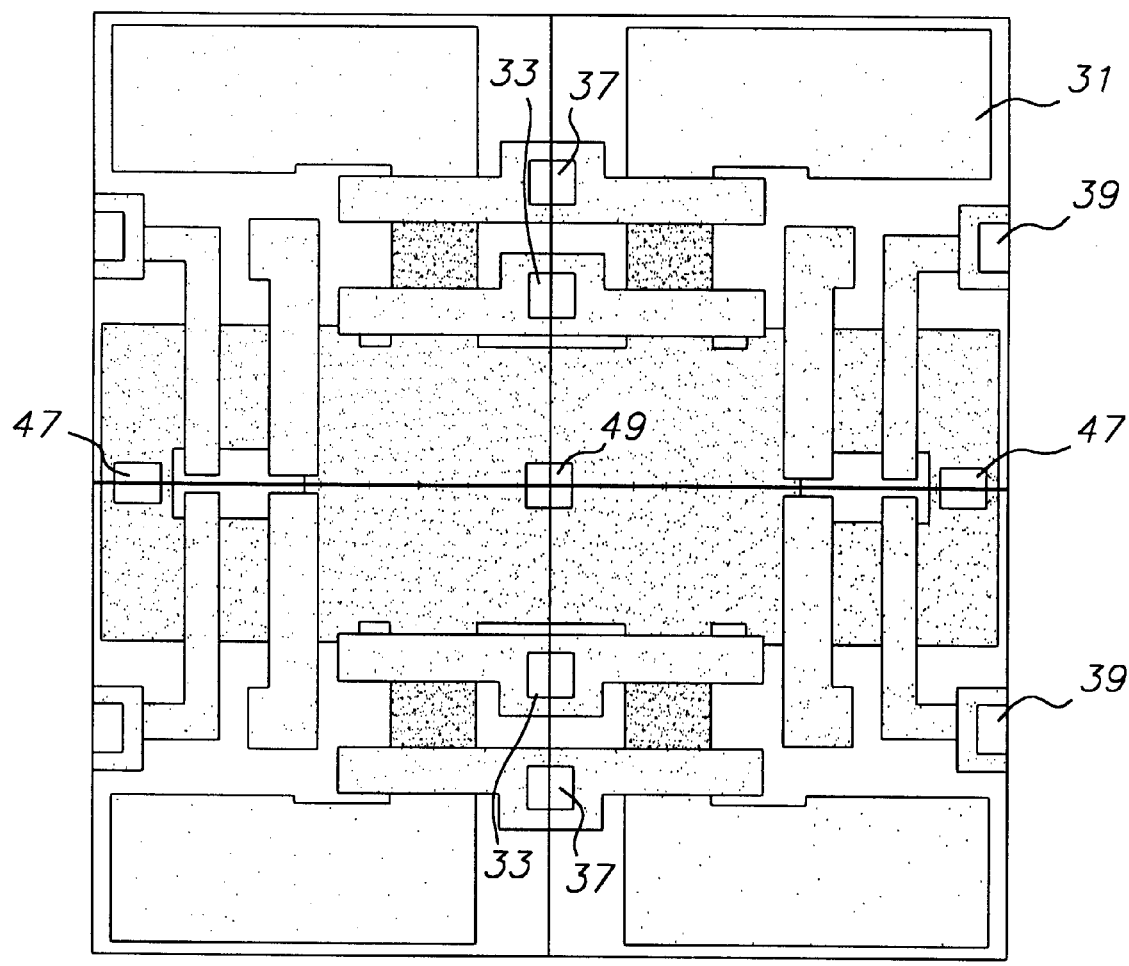
FIG. 5B is a top view of 4 pixels of the present invention that are a mirror duplication of the two pixels in FIG. 4B that illustrates the sharing of contact regions that are common to a column.

An array of pixels is then constructed in the following manner. First, a new pixel is created by mirroring the original pixel shown in FIG. 3 in the x-dimension. The new pixel is then butted with the original pixel by placing the half contact regions adjacent to each other. This is shown in FIGS. 4A and 4B. In FIG. 4A, VDDC 48 is shared by 2 pixels. OUTC 46 is placed along a pixel border so that it may be shared with another pixel. In FIG. 4B, VDDC 49 is placed along the bottom edge of the pixel so that it can be shared by 4 pixels. This can be done since the VDDC 49 node is common to all pixels, rows and columns. OUTC 47 is placed along a pixel border so that it may be shared by another pixel. The transfer gate 32 and the transfer gate contact 33 are also mirrored and shared by the two pixels shown in FIGS. 4A and 4B. Next this group 2 pixels mirrored in the y-dimension then created another set of 2 pixels. These sets of 2 pixels are then butted so that the half contact regions for VDDC and OUTC are adjacent to each other. This is shown in FIGS. 5A and 5B, corresponding to FIGS. 4A and 4B, respectively. This set of 4 pixels is then arrayed to produce the desired number of pixels in the image sensor.

Figure 6:
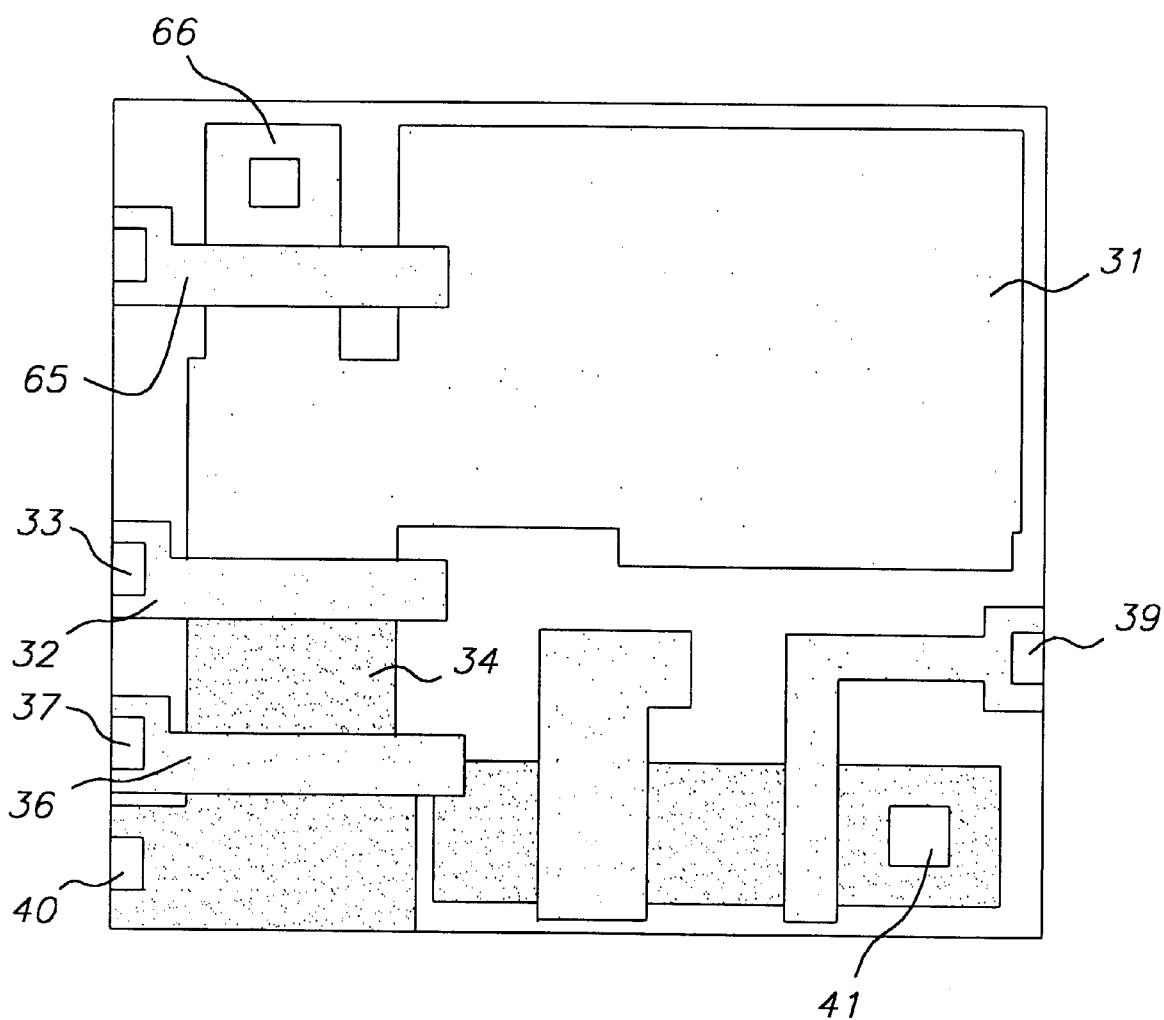
FIG. 6 is the pixel of FIG. 4A that includes a lateral overflow gate and drain.
Figure 7:
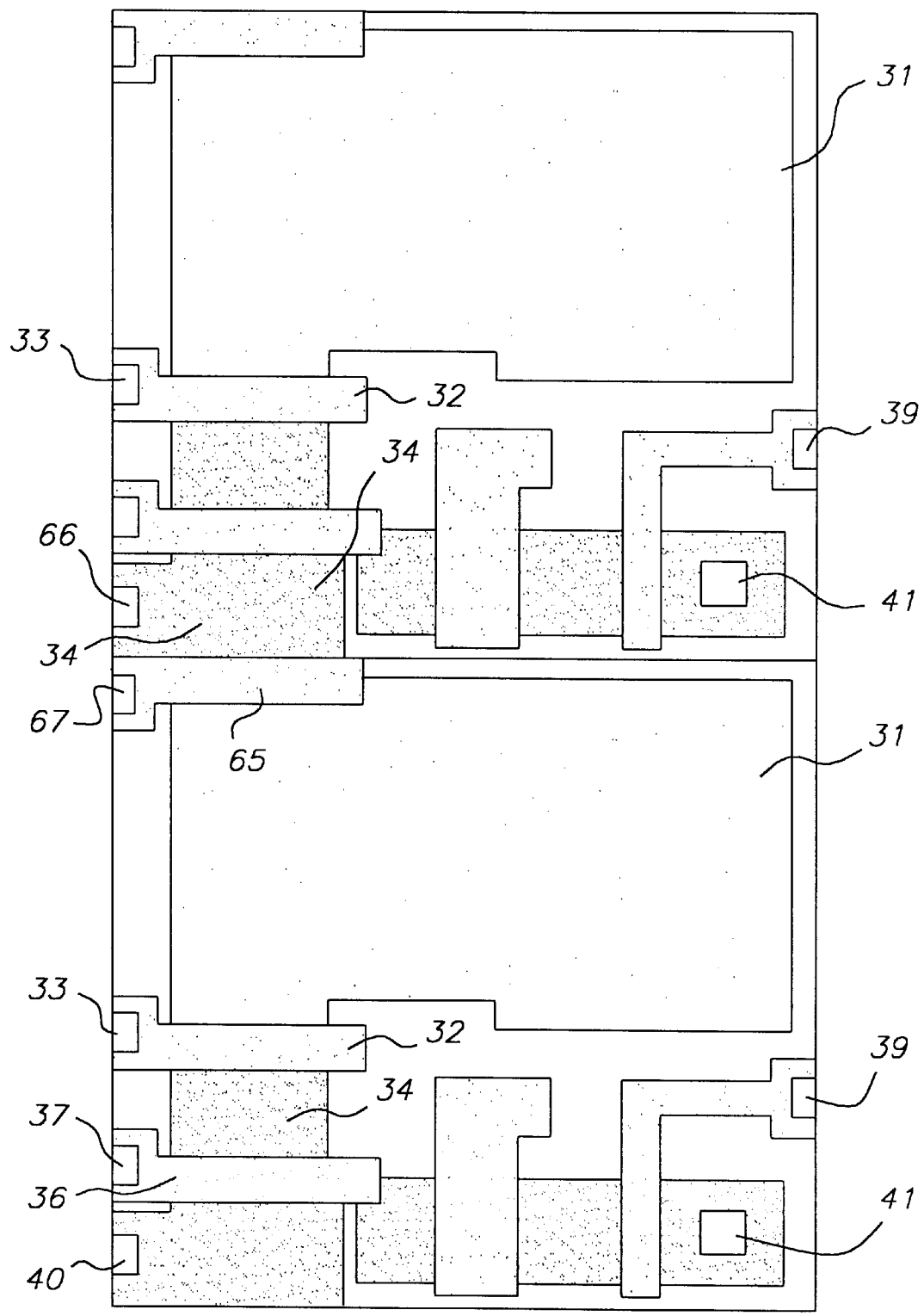
FIG. 7 is a diagram of 2 of the pixels as shown in FIG. 4A with a lateral overflow gate for each pixel and VDD of the adjacent pixel used as a lateral overflow drain.

In order to provide antiblooming control during readout of the sensor, it is necessary to provide an overflow drain for the photodetector. The simplest approach in a CMOS process is to provide a lateral overflow drain that is separated from the photodetector 31 by a gate 65. If one were to include a lateral overflow drain 66 in each pixel, this would further reduce the fill factor of the pixel, and adversely affect the sensitivity of the pixel. This is shown in FIG. 6. However, by placing the VDD region appropriately within the pixel, this can be used as the lateral overflow drain for the adjacent pixel or pixels. One example of this is shown in FIG. 7. This VDD serves as the power source for the amplifier for the top pixel in FIG. 7 while serving as the overflow drain for the bottom pixel in FIG. 7. Since the lateral overflow drain 66 is now in another pixel, the pixel fill factor is not affected. By using this approach, antiblooming control during readout is achieved without impacting pixel fill factor.

Figure 8:
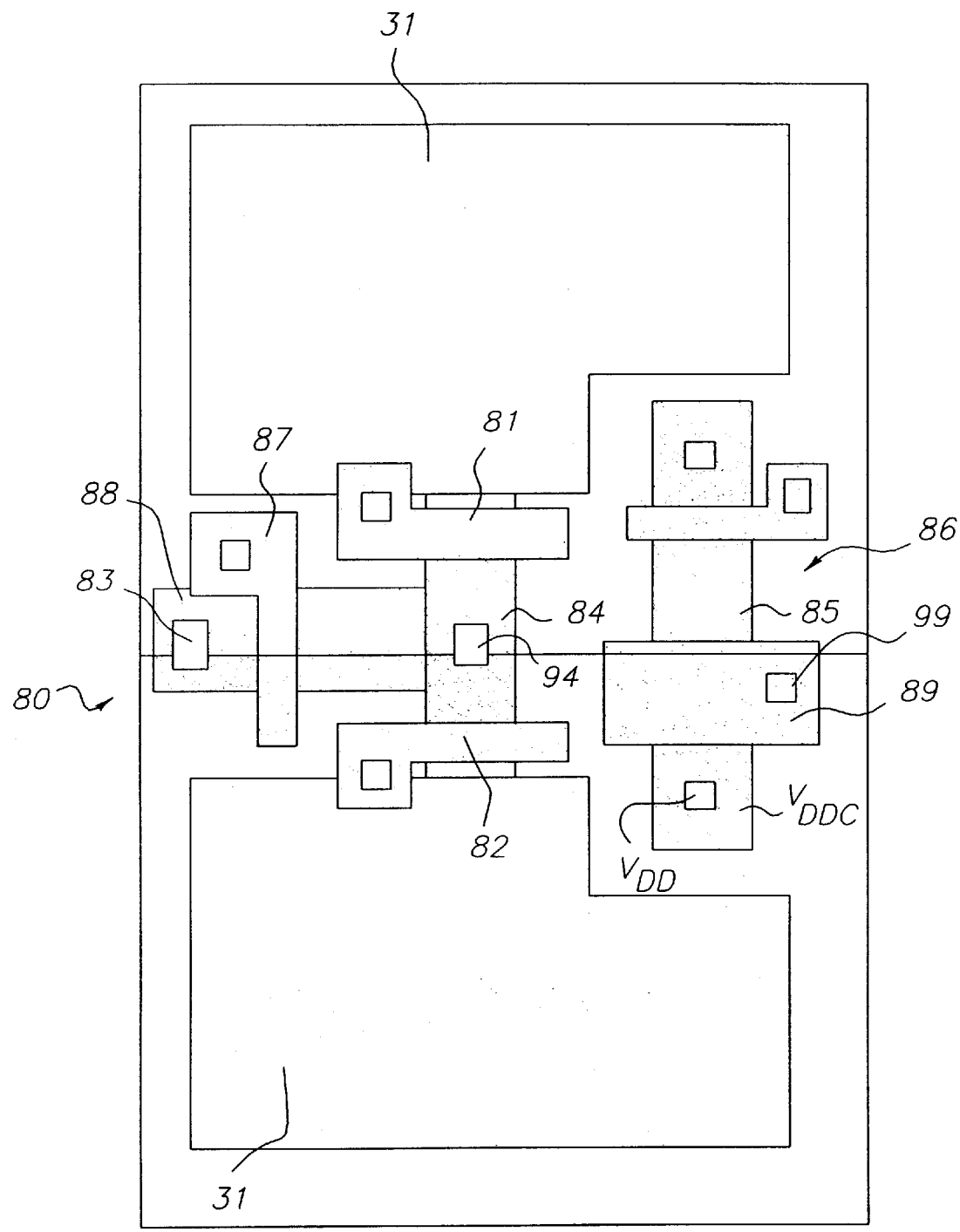
FIG. 8 is an illustration of 2 pixels sharing floating diffusion, reset gate, reset drain VDD, amplifier, row select gate, and output contact region.

Finally, FIG. 8 illustrates a new design of a pixel 80 that shares the floating diffusion 84, with associated floating diffusion contact 94, amplifier 85, with associated drain contact VDDC, row select transistor 86, and reset gate 87 with an adjacent pixel that is in a separate row. In this case the row select signal for 2 consecutive rows is actually the same. Image signal separation is achieved by having separate Transfer Gates 81, 82 in each pixel. The operation occurs in the following manner. Row A is integrated, and the gate of the row select transistor 85 is turned on. The floating diffusion 84 is then reset by pulsing the reset gate 87. This reset signal is then read out for row A. Transfer Gate 81 is then pulsed on and the signal charge from photodetector A is transferred onto the floating diffusion 84. The signal level is the read out for row A. Next the floating diffusion 84 is reset by pulsing on reset gate 87 again. The reset level for row B is then read out. TGB is then pulsed on to transfer the signal charge from photodetector B onto the floating diffusion. The signal level is then read out for row B. This procedure is then repeated for the remaining pairs of rows on the device.

In the embodiment as shown in FIG. 8, the resent drain 88 is separate from the amplifier drain VDD. As shown in FIG. 8, the reset drain 88 is shared between both adjacent pixels, as is the reset drain contact.

Figure 9:
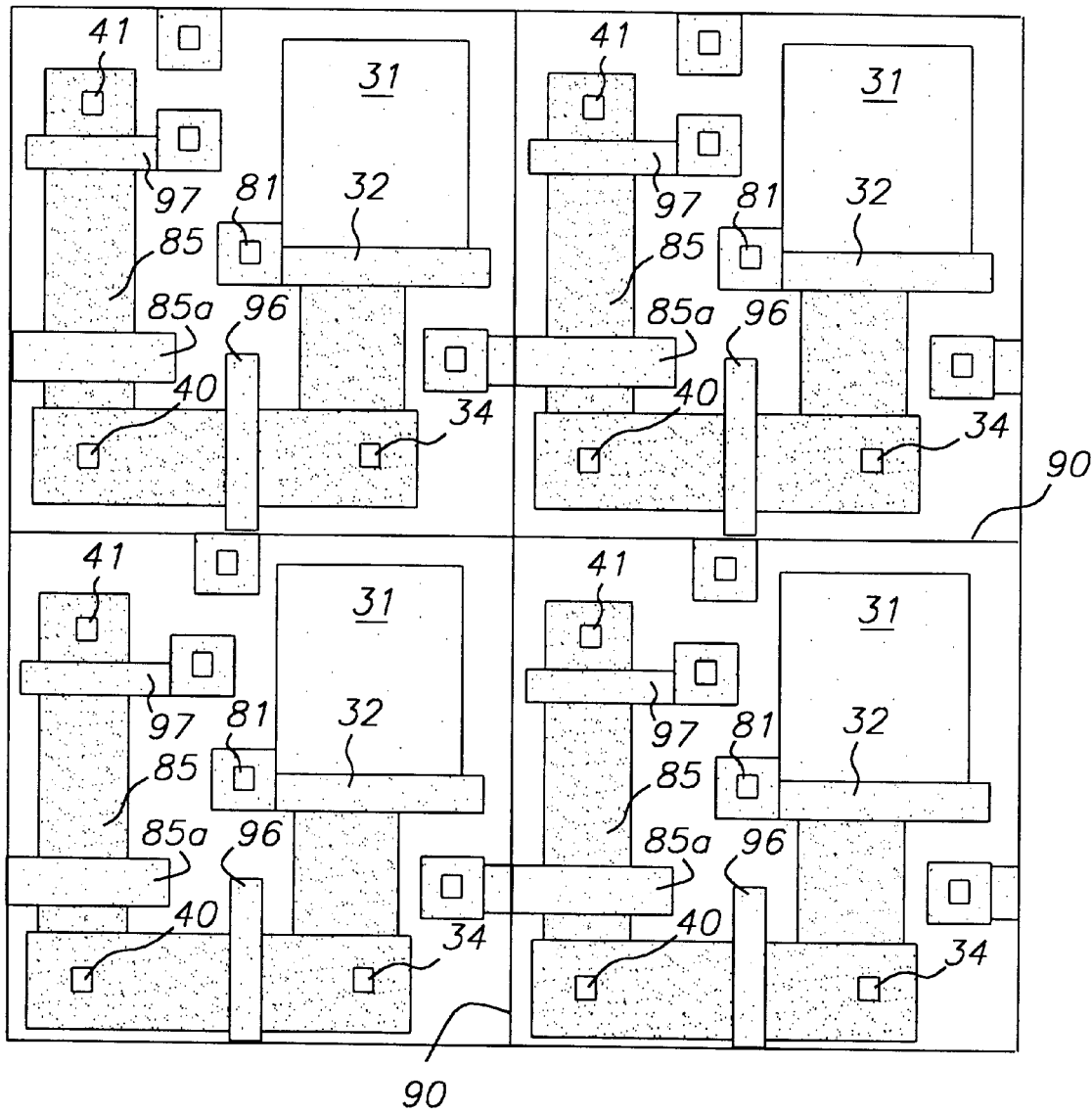
FIG. 9 is a top view of 4 pixels illustrating operative interconnection of electrical components across pixel boundaries.

FIG. 9 is a top view of 4 pixels of the present invention illustrating it the concept of routing or interconnecting across pixel boundaries. A contact region for the signal transistor is placed to the right side of the floating diffusion and ends at the right side of the pixel boundary 90. When another pixel is butted to the right side, this completes the connection of the floating diffusion to the signal transistor. This is done similarly with the reset gate using the top and bottom boundaries of the pixel. This concept provides the ability to have minimum routing and interconnect area.

Although not shown in these examples, it is desirable to design the pixel so the photodetector occupies the same site within the pixel even when the pixel is mirrored so the modulation transfer function of the imager is constant throughout the device.

It should be noted that although not shown in the drawings, each of the features detailed in this invention can be used in conjunction with each other to produce other physical layouts and embodiments that provide the advantages discussed.

The invention has been described with reference to a preferred embodiment, however, it will be appreciated that variations and modifications can be effected by a person of ordinary skill in the art without departing from the scope of the invention.

PARTS LIST 3 row select gate contact 3
4 row select transistor
5 signal transistor
8 output node contact
9 power supply contact (VDDC)
10 prior art pixel
11 photodetector
12 transfer gate
13 transfer gate contact
14 floating diffusion
16 reset gate
17 reset gate contact
30 pixel
31 photodetector
32 transfer gate
33 transfer gate contact
34 floating diffusion
36 reset gate
37 reset gate contact
38 row select gate
39 row select gate contact
40 VDDC
41 OUTC
45 OUTC
46 OUTC
47 OUTC
48 VDDC
49 VDDC
65 lateral overflow gate
66 lateral overflow drain
80 pixel
81 transfer gate contact
82 transfer gate
83 reset drain contact
84 floating diffusion
85 amplifier
86 row select transistor
87 reset gate
88 reset drain
89 signal transistor
90 pixel boundary
97 reset transistor
99 amplifier contact

What is claimed is:

1. An image sensor having a plurality of pixels comprising:

a semiconductor material of a first conductivity type; and at least two adjacent pixels each having photodetectors formed within the substrate such that each pixel has at least one electrical component that is functionally associated with one of the adjacent pixels and at least a portion of the electrical component is structurally located within the adjacent pixel, wherein the electrical component is selected from one of the following components (a reset gate or an amplifier).

* * * * *